Jan. 7, 1969 W. B. MITCHELL ET AL 3,421,025

HIGH-SPEED AVALANCHE SWITCHING CIRCUIT

Filed March 18, 1966

INVENTORS:
WALTER B. MITCHELL
RONALD C. TAYLOR
BY
Curtis, Morris & Safford
ATTORNEYS.

United States Patent Office 3,421,025

Patented Jan. 7, 1969

3,421,025

HIGH-SPEED AVALANCHE SWITCHING CIRCUIT

Walter B. Mitchell, Danbury, and Ronald C. Taylor, Brookfield, Conn., assignors to National Semiconductor Corporation, Danbury, Conn.

Filed Mar. 18, 1966, Ser. No. 535,589

U.S. Cl. 307—283 5 Claims

Int. Cl. H03k 3/26

ABSTRACT OF THE DISCLOSURE

A high speed semiconductor switching circuit including an avalanche transistor having a major current-carrying path with a S-negative impedance characteristic and a voltage regulating device connected across the major current-carrying path of the avalanche transistor, the regulating voltage of said regulating device being lower than the minimum break-down voltage which can be applied to the major current-carrying path of the avalanche transistor.

This invention relates to semiconductor devices and circuits; more particularly, this invention relates to semiconductor devices in which the impedance changes vary rapidly from a high to a low level; still more particularly, the present invention relates to avalanche transistors and circuit devices.

The invention will be described with reference to the drawings, in which.

Figure 1:
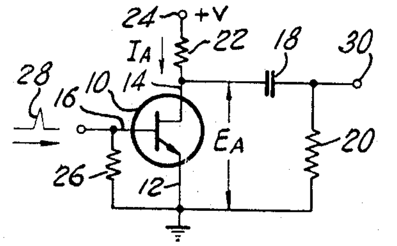
FIG. 1. (PRIOR ART)
FIGURE 1 is a schematic circuit diagram of a prior art avalanche transistor circuit.

The circuit diagram in FIGURE 1 depicts a typical prior art "avalanche" pulse generator circuit. This circuit includes an avalanche transistor 10 with an emitter lead 12, a collector lead 14, and a base lead 16. A series combination of a capacitor 18 and a load resistor 20 is connected between the collector 14 and emitter 12, and the emitter 12 is connected to ground. The collector 14 is connected through a relatively high-resistance current-limiting resistor 22 to a bias terminal 24 to which is connected a source of positive DC voltage V. A resistor 26 of relatively low resistance is connected between the base 16 and emitter 12 of transistor 10. As will be described in greater detail below, when a pulse 28 is applied to the base lead 16 of the avalanche transistor 10, the transistor changes from a high-impedance condition to a low-impedance condition, thus developing on output terminal 30 an output signal with a substantially rectangular wave form.

The emitter-collector path of the avalanche transistor 10, that is, the path through the emitter lead 12, the transistor, and the collector lead 14, forms the major current-carrying path through the transistor. The base electrode 16 serves as a control electrode for changing the conduction characteristics of the emitter-collector path.

As is well known, the avalanche transistor 10 has the characteristic that its emitter-collector path has a very high impedance when the voltage $E_A$ applied between the emitter and collector is below a certain critical value known as the "breakdown" voltage. However, the emitter-collector impedance can be changed very rapidly from a high value to a very low value by at least two different methods. One such method is simply to apply between the emitter and collector leads a voltage $E_A$ which is above the breakdown voltage of the device. Then the impedance decreases very rapidly to a value near zero, and the current flow through the transistor is limited primarily by the external impedance connected to the emitter-collector path (e.g., resistor 20 in the FIGURE 1 circuit).

Another way of creating the above-described "breakdown" effect and turning the transistor "on" is to apply an emitter-collector voltage $E_A$ which has a value less than the breakdown voltage, and then apply a gating signal such as pulse 28 to the base electrode 16.

Regardless of the method of turning the avalanche transistor on, the transistor has the capability of turning on very rapidly, and has the capability of sustaining a very large current flow when it is in a conducting state. For example, avalanche transistors providing turn-on times of the order of a few nanoseconds (billionths of a second) and current carrying capacities up to several amperes are known in the prior art.

Figure 2:
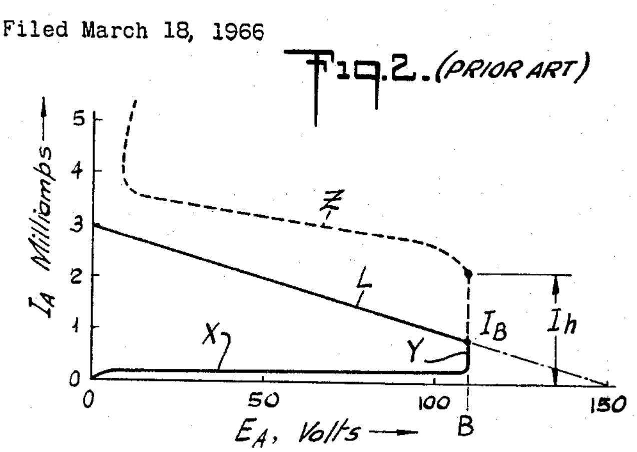
FIG. 2. (PRIOR ART)
FIGURE 2 is a graph illustrating typical operational characteristics of the circuit shown in FIGURE 1.

FIGURE 2 shows typical curves demonstrating the variation of the applied emitter-collector voltage $E_A$ with the emitter-collector current $I_A$ of the avalanche transistor 10. The portion of the curve corresponding ot the high-impedance condition of the transistor is identified by the letter X. In the X portion of the curve the transistor 10 is turned off and very little current flows.

When the applied voltage reaches the value B of the breakdown voltage (assuming a gating signal is not applied to the base lead 16), the impedance of the emitter-collector path changes so that the current $I_A$ increases while the voltage $E_A$ remains almost constant. The portion of the curve demonstrating this function is identified by the letter Y. As will be explained further below, the Y portion of the curve usually is known as the "holding" portion.

When the current $I_A$ increases to a value $I_h$, at the upper end of the holding portion of the characteristic, the entire emitter-collector path of the transistor 10 suddenly becomes highly conductive and if there were no external impedance connected to the emitter-collector path, the characteristic curve would follow a path such as is indicated by the dashed line Z in which the current flow is substantially unlimited and voltage across the emitter-collector path is very low. The characteristic curve XYZ thus created has been called an "S-negative" curve because of the fact that it somewhat resembles the letter S. Thus, the avalanche transistor and devices such as the silicon controlled rectifier which exhibit similar characteristics are known as "S-negative" devices.

The circuit shown in FIGURE 1 is designed so that the emitter-collector current flow $I_A$ through the avalanche transistor 10 is limited to a value $I_B$ (see FIGURE 2) considerably lower than the holding current $I_h$ so that the transistor 10 will not break down until a gating signal is applied to the base lead 16. This is done by selecting the bias voltage V and the resistance of the current limiting resistor 22 so that a load-line L is created which intersects the Y or holding portion of the transistor characteristic at a current value considerably below $I_h$. As long as no input pulse 28 is applied to the base electrode 16, the emitter-collector current will hold at the value $I_B$. When the pulse 28 is applied, the emitter-collector path breaks down completely and rapidly and the current $I_A$ is limited only by the resistance of resistor 20 and the very small internal resistance of the emitter-collector path of the transistor 10.

The circuit in FIGURE 1 operates to develop output pulses at output terminal 30 as follows. When the transistor 10 is "turned off," that is, when it is in the high impedance condition, the voltage $E_A$ increases as the capacitor 18 is charged from the voltage supply V.

When $E_A$ reaches the breakdown voltage B, the current $I_A$ quickly assumes the value $I_B$ determined by the crossing of the load line L with the Y portion of the characteristic curve. Then, when a pulse 28 is applied to the base electrode 16 of the transistor, the transistor switches rapidly into full conduction, thus quickly connecting the collector terminal 14 to ground through a low impedance. Since capacitor 18 has a voltage V across it at the time of switching, the voltage at output terminal 30 suddenly changes from 0 to approximately negative V volts. Thus, a sharp negative pulse is applied to output terminal 30. Then, the charge stored in capacitor 18 discharges through transistor 10 until the voltage at the collector 14 rises to a value such that the transistor 10 no longer can remain in a "breakdown" condition and abruptly returns to a high-impedance condition. This creates a sharp positive-going pulse at terminal 30 which completes the output wave cycle. Then, the capacitor 18 again is charged and the cycle is repeated.

The capacitance of capacitor 18 and the resistance of resistor 20 are selected so as to give the output signal a desired wave form. For example, in a typical circuit having parameters giving the curves shown in FIGURE 2, the capacitance of capacitor 18 is 0.001 microfarad, and the resistance of resistor 20 is 50 ohms. The resistance of resistor 26 also is low, e.g. 50 ohms.

The value of resistor 22 is relatively high, e.g., 50,000 ohms, and voltage V is 150 volts. Thus, the load line L (FIGURE 2) intersects the ordinate of the graph at 3 milliamperes (thousandths of an ampere) and intersects the abscissa of the graph at 150 volts. A typical avalanche transistor has a breakdown voltage B of around 110 volts, as is shown in FIGURE 2.

A major problem with prior avalanche transistors is created by the fact that the switching speed of the transistor decreases as the holding current $I_h$ increases. Hence, it is desired to keep the holding current at a minimum in order to maximize the switching speed of the transistor. However, if the holding current is made too low, the transistor will not be stable. This is due to the fact that if the holding current is so low that it falls below the load line L (see FIGURE 2), the transistor will "free-run"; that is, the transistor will break down as soon as $E_A$ reaches the breakdown voltage B without an input pulse 28. The transistor then would turn off after the voltage $E_A$ dropped to a low enough value, would turn on again when $E_A$ increased again to breakdown voltage B, and so forth. In fact, for satisfactory stability of the transistor in prior circuits, it has been necessary to make the holding current considerably higher than the $I_B$ current in order to compensate for temperature drift of $I_h$ and transients which otherwise might deleteriously affect the operation of the circuit. In the past it has been exceedingly difficult to make fast-switching avalanche transistors having holding currents high enough to give them satisfactory stability.

Accordingly, it is a major object of the present invention to provide a switching semiconductor device having a high switching speed and a high current-carrying capacity, and which is stable in operation. Another object is to provide such a device which can be manufactured with relatively high production yields and at a relatively low cost. Further objects of this invention will be pointed out in or apparent from the following description.

Figure 3:
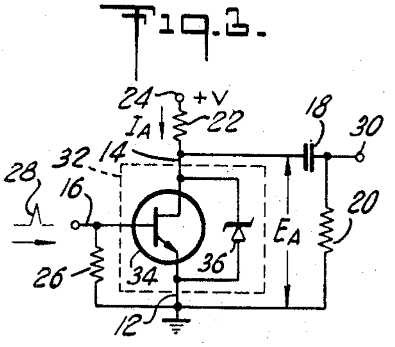
FIGURE 3 is a schematic circuit diagram of one circuit embodying the present invention.

FIGURES 3 through 8 of the drawings describe the present invention. The pulse-producing circuit shown in FIGURE 3 is identical to that shown in FIGURE 1 except that in FIGURE 3 a new circuit element 32 has replaced the avalanche transistor 10 shown in FIGURE 1. Circuit element 32 consists of a high-speed, low-holding-current avalanche transistor 34 with a Zener or "avalanche" diode 36 connected between the collector electrode 14 and the emitter electrode 12 of the transistor 34. The cathode of diode 36 is connected to the collector 14 and the anode is connected to the emitter 12 so that with a positive voltage applied between the emitter and collector diode 36 is reverse-biased.

Figure 4:
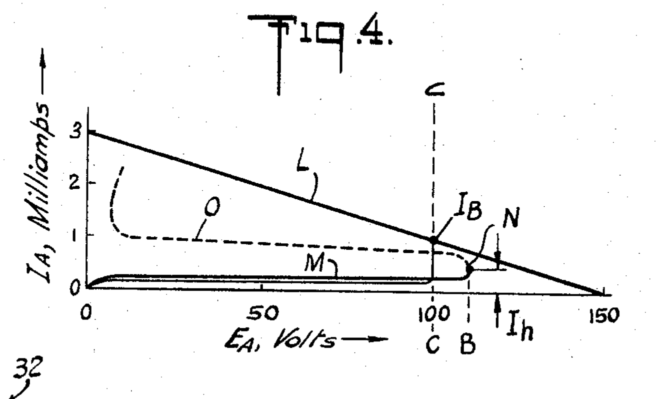
FIGURE 4 is a graph illustrating typical operational characteristics of the circuit shown in FIGURE 3.

Referring now to FIGURE 4, which shows the operational characteristics for the FIGURE 3 circuit, avalanche transistor 34 gives the characteristic curve MNO and has a very low holding current $I_h$. In fact, the holding current is so low that it falls well below the load line L at the breakdown voltage B of transistor 34. Although the value of the holding current $I_h$ shown in FIGURE 4 appears to be substantial, it typically is very low, e.g., of the order of 10 micro-amps (10 millionths of an ampere). Thus, the switching speed of the transistor is very fast.

Despite the fact that the holding current of transistor 34 falls below the load line L, the circuit shown in FIGURE 3 does not "free run" and actually is quite stable. This is because the Zener or "avalanche" diode 36 goes into an "avalanche" condition at a voltage value C which is just below the breakdown voltage B of the avalanche transistor 34. For example, for the devices shown in FIGURES 3 and 4, the avalanche transistor breakdown voltage B is approximately 110 volts, and the avalanche voltage of diode 36 is approximately 100 volts. When the applied voltage $E_A$ reaches the value C, the diode 36 conducts and prevents the voltage from rising any higher. When the diode is in this "avalanche" condition, the current through it is limited primarily by the external impedance (the current-limiting resistor 22). Thus, the current through diode 36 is determined by the intersection between the characteristic curve of the diode and the load line L and has the value $I_B$. The current through the diode 36 remains at the value $I_B$ and the current through avalanche transistor 34 remains very small until a pulse 28 is applied to the base 16 of the transistor 34. Then, the transistor 34 is switched into a breakdown condition and rapidly provides a very low impedance path between its emitter and collector. This develops an output pulse at terminal 30, which is formed in the manner described above after the breakdown of transistor 10 in FIGURE 1. However, the switching speed of the FIGURE 3 circuit is much faster than that shown in FIGURE 1. The present invention has made it possible to use high speed avalanche transistors not previously usable in such a manner.

Surprisingly, the use of the diode 36 in combination with the avalanche transistor 34 greatly improves the "yield" of usable avalanche transistors obtained in the usual manufacturing process. This is because many transistors previously had to be discarded because their holding currents were too low, although they were in all other respects satisfactory, and even had very superior switching speeds. With the present invention these transistors can be used to create a circuit switching device of superior performance. The resulting increase in yield is so great that it greatly reduces manufacturing costs despite the addition of a Zener diode and interconnections.

The value of the breakdown voltage B of an avalanche transistor varies with ambient temperature. Therefore, the Zener diode 36 should be selected to have an avalanche voltage C which varies with temperature in approximately the same manner as the breakdown voltage B of the avalanche transistor. Thus, as the ambient temperature of the circuit environment changes, the difference between the avalanche voltage C of the diode and the breakdown voltage B will remain approximately constant and the device 32 will be extremely stable.

The circuit device 32 can take many different physical forms. It can comprise a discrete avalanche transistor connected to a discrete Zener or "avalanche" diode as is shown in FIGURE 3. Other forms are shown in FIGURES 5 through 8.

Figure 5:
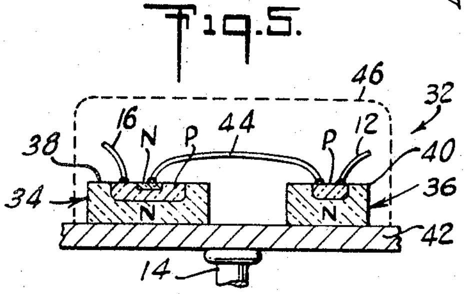
FIGURE 5 is a cross-sectional view of one embodiment of a circuit element forming a part of the device shown in FIGURE 3.

FIGURE 5 shows one alternative form which the circuit device 32 may take. The transistor 34 and diode 36 are formed in separate "dice" 38 or 40, respectively, of silicon semiconductor material. Both dice 38 and 40 are mounted on a metal "header" 42 to the underside of which is connected to the collector lead 14. The transistor 34 has a known double-diffused n-p-n construction. Lead wire 16 is secured to the p region of the transistor to form the base lead of the device 32. A lead wire 44 connects the n-type emitter region of transistor 34 to p-type-region of diode 36. A lead wire 12 is connected to the p-type region of diode 36 and forms the emitter lead of the device 32. Suitable means, well known in the prior art, can be used to provide external connections to lead wires 12 and 16, and the entire device 32 can be encapsulated in a metal, plastic or other suitable housing indicated schematically by dashed line 46. The structure shown in FIGURE 5 has the advantage that both devices 34 and 36 are mounted close to one another in a single housing and will be subjected to approximately the same ambient temperatures. Thus, the difference between the avalanche voltage of diode 36 and the breakdown voltage of transistor 34 tends to remain relatively constant.

Figure 6:
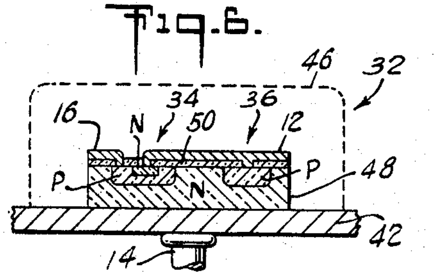
FIGURE 6 is a cross-sectional view of another embodiment of the element shown in FIGURE 5.

FIGURE 6 illustrates another alternative form of the device 32. This structure is identical to that shown in FIGURE 5 except that the devices 34 and 36 are formed in a single wafer 48 of silicon, thus forming a "monolithic" integrated circuit. An oxide coating 50 covers the entire upper surface of the device except for selected areas to which it is desired to make contact. The metal leads 12 and 16 are formed by known techniques as thin metal ribbons on the oxide surface and extend through the holes in the oxide to make contact with the devices in the wafer. The FIGURE 6 structure has the advantage that it is is somewhat simpler to assemble than the FIGURE 5 structure. The encapsulating enclosure 46 can be a known "flat-pack" type of enclosure, if desired. In the latter case, the collector lead 14 and leads 12 and 16 would extend from the sides of a flat rectangular package, as is well known in the prior art.

Figure 7:
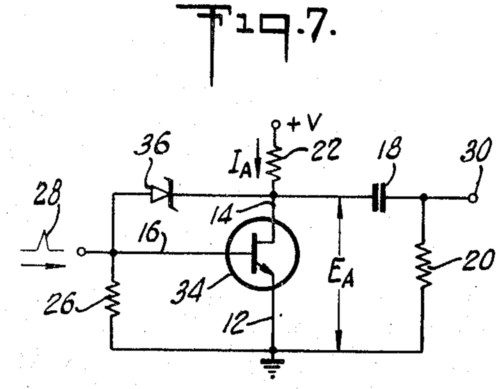
FIGURE 7 is a schematic diagram of another circuit embodying the present invention.

FIGURE 7 shows an alternative circuit arrangement constructed in accordance with the present invention. Its operation is substantially identical to that of the FIGURE 3 circuit. The difference is that the anode of diode 36 is connected to the base lead 16 rather than the emitter lead 12 of a transistor 34. However, since the resistance of resistor 26 is very low (e.g. 50 ohms, as specified above), the connection shown in FIGURE 7 is virtually the same as that shown in FIGURE 3 in which the cathode is connected to the emitter. In eitther circuit, the diode provides a voltage regulating device in parallel with the emitter-collector path of the transistor 34.

Figure 8:
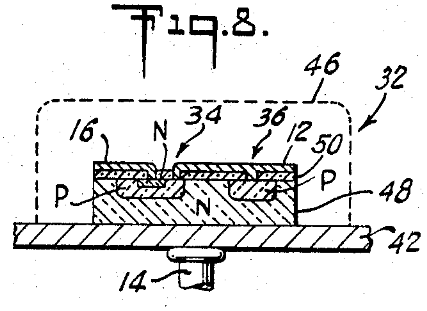
FIGURE 8 is a cross-sectional view of one embodiment of a circuit element forming a part of the circuit shown in FIGURE 7.

The FIGURE 7 circuit is shown in FIGURE 8 in monolithic integrated circuit form. It is identical to the FIGURE 6 device except that the lead 16 contacts both the diode 36 and the base region of transistor 34, whereas the lead 12 contacts only the emitter region of transistor 34.

The Zener diode 36 may be replaced with an ordinary reverse-biased diode or, in fact, a reverse-biased p-n semiconductor junction which has an avalanche characteristic such as line C—C shown in FIGURE 4. In fact, devices other than p-n junctions may be usable if they have the ability to regulate voltages so as to give voltage-current curves such as that shown in FIGURE 4 for the diode 36.

It is believed that the device 32 significantly increases the repetition rate of signal generator circuits in which it is used. The maximum "repetition rate" of such a circuit is the maximum number of pulses per second which can be generated in the circuit without overheating the circuit components. Since the diode 36 is connected in parallel with the major current-carrying path of the avalanche transistor 34, the diode 36 carries substantially all of the current flow through the element 32 during the "holding period," and the transistor 34 carries the current the remainder of the time. Thus, the transistor 34 conducts current for only part of the time during each cycle and does not heat as fast as it would if it carried all of the current at all times.

The above description is intended to be merely illustrative of the present invention and should not be interpreted in a limiting sense. The circuit device 32 can be used in many applications where ordinary avalanche transistors have been used in the past. For instance, the device 32 can be used to advantage to replace the avalanche transistors in the circuit shown in U.S. Patent 3,303,356 issued Feb. 7, 1967 and assigned to the same assignee as this application. It should be apparent that such use and other modifications of the specific embodiments disclosed above can be made without avoiding the use of the present invention.

We claim:

1. A semiconductor device comprising, in combination, an avalanche transistor, an avalanche diode, the avalanche voltage of said diode being less than the breakdown voltage of said transistor, and means for connecting said diode in parallel with said avalanche transistor.

2. Apparatus as in claim 1 in which said avalanche diode has an anode and a cathode, said transistor has base, emitter and collector leads, said anode is connected to said emitter lead and said cathode is connected to said collector lead.

3. Apparatus as in claim 2 including a current-limiting element and bias voltage terminal means connected in series with said transistor.

4. Apparatus as in claim 3 including a resistor connected between said base and emitter leads, and a series resistance-capacitance combination connected in parallel with said emitter-collector path.

5. Apparatus as in claim 1 in which said avalanche transistor has base, emitter and collector leads, said diode has an anode and a cathode, said cathode is connected to said collector lead, and said anode is connected to said base lead, with a resistor of relatively low-resistance value connected between said base and emitter leads.

References Cited

UNITED STATES PATENTS

| | | | |
|---|---|---|---|
| 3,126,516 | 3/1964 | Peaslee | 307—283 XR |
| 3,242,416 | 3/1966 | White | 307—318 XR |
| 3,246,206 | 4/1966 | Chowdhuri | 307—202 XR |

ARTHUR GAUSS, *Primary Examiner.*

S. D. MILLER, *Assistant Examiner.*

U.S. Cl. X.R.

307—285, 302, 303, 318, 202, 260